(12) United States Patent
Grede et al.

(10) Patent No.: US 10,714,313 B2
(45) Date of Patent: Jul. 14, 2020

(54) HIGH FREQUENCY AMPLIFIER APPARATUSES

(71) Applicant: TRUMPF Huettinger GmbH + Co. KG, Freiburg (DE)

(72) Inventors: Andre Grede, Freiburg (DE); Alexander Alt, Freiburg (DE); Daniel Gruner, Muellheim (DE); Anton Labanc, Ehrenkirchen (DE)

(73) Assignee: TRUMPF Huettinger GmbH + Co. KG, Freiburg (DE)

(*) Notice: Subject to any disclaimer, the term of this patent is extended or adjusted under 35 U.S.C. 154(b) by 206 days.

(21) Appl. No.: 15/854,163

(22) Filed: Dec. 26, 2017

(65) Prior Publication Data
US 2018/0122621 A1 May 3, 2018

Related U.S. Application Data

(63) Continuation of application No. PCT/EP2016/065376, filed on Jun. 30, 2016.

(30) Foreign Application Priority Data

Jun. 30, 2015 (DE) .................. 10 2015 212 247

(51) Int. Cl.
  *H01J 37/32* (2006.01)
  *H03F 3/193* (2006.01)
  *H03F 3/30* (2006.01)
(52) U.S. Cl.
  CPC ........ *H01J 37/32174* (2013.01); *H03F 3/193* (2013.01); *H03F 3/3001* (2013.01); *H03F 2200/451* (2013.01)
(58) Field of Classification Search
  None
  See application file for complete search history.

(56) References Cited

U.S. PATENT DOCUMENTS 4,560,851 A  12/1985  Tsukamoto et al.
5,691,557 A  11/1997  Watanabe
(Continued)

FOREIGN PATENT DOCUMENTS

DE  3240726  5/1983
EP  1691481  8/2006
(Continued)

OTHER PUBLICATIONS

'www.seekic.com' [online]. Apr. 12, 2017 <www.seekic.com/uploadfile/ic-circuit/s200971322422125.gif>. 1 page.
(Continued)

*Primary Examiner* — Alexander H Taningco
*Assistant Examiner* — Srinivas Sathiraju
(74) *Attorney, Agent, or Firm* — Fish & Richardson P.C.

(57) ABSTRACT

The invention relates to high-frequency amplifier apparatuses suitable for generating power outputs of at least 1 kW at frequencies of at least 2 MHz. The apparatuses include two LDMOS transistors each connected by their source connection to ground. The transistors can have the same design and can be arranged in an assembly (package). The apparatus also includes a circuit board lying flat against a metallic cooling plate and connected to the cooling plate, which can be connected to ground, and the assembly is arranged on or against the circuit board. The apparatuses have a power transformer, whose primary winding is connected to the drain connections of the transistors, and a signal transmitter. A secondary winding of the signal transmitter is connected to the gate connections of the two transistors. Each of the gate connections is connected to ground via at least one voltage-limiting structural element.

6 Claims, 2 Drawing Sheets

(56) References Cited

U.S. PATENT DOCUMENTS

| | | | |
|---|---|---|---|
| 6,046,641 A | 4/2000 | Chawla et al. | |
| 6,064,249 A | 5/2000 | Duvvury et al. | |
| 6,157,258 A | 12/2000 | Adishian et al. | |
| 6,172,383 B1 | 1/2001 | Williams | |
| 6,313,587 B1* | 11/2001 | MacLennan | H01J 61/025 315/224 |
| 6,949,887 B2* | 9/2005 | Kirkpatrick | H01J 61/025 315/246 |
| 8,237,501 B2 | 8/2012 | Owen | |
| 8,344,801 B2 | 1/2013 | Owen et al. | |
| 9,147,555 B2* | 9/2015 | Richter | H01J 37/32018 |
| 9,276,456 B2* | 3/2016 | Grede | H01J 37/32174 |
| 9,490,752 B2* | 11/2016 | Briffa | H03G 3/3042 |
| 9,684,327 B2* | 6/2017 | Fritsch | G05F 3/00 |
| 9,768,731 B2* | 9/2017 | Perreault | H03F 1/02 |
| 10,002,749 B2* | 6/2018 | Grede | H01J 37/32064 |
| 10,026,593 B2* | 7/2018 | Alt | H01J 37/32174 |
| 10,038,461 B2* | 7/2018 | Briffa | H03F 1/0216 |
| 10,042,407 B2* | 8/2018 | Grede | H01J 37/32944 |
| 10,312,064 B2* | 6/2019 | Grede | H01J 37/32944 |
| 10,348,186 B2* | 7/2019 | Schuler | H02M 7/06 |
| 10,354,839 B2* | 7/2019 | Alt | H01L 29/7835 |
| 10,354,840 B2* | 7/2019 | Bock | H01J 37/32183 |
| 10,396,720 B2* | 8/2019 | Grede | H03F 3/3001 |
| 2002/0149425 A1 | 10/2002 | Chawla et al. | |
| 2003/0215373 A1 | 11/2003 | Reyzelman et al. | |
| 2005/0083122 A1 | 4/2005 | Meyers | |
| 2006/0158911 A1 | 7/2006 | Lincoln et al. | |
| 2009/0027936 A1 | 1/2009 | Glueck et al. | |
| 2011/0241781 A1 | 10/2011 | Owen et al. | |
| 2014/0167858 A1 | 6/2014 | Van Zuijlen et al. | |
| 2014/0361690 A1 | 12/2014 | Yamada et al. | |
| 2014/4361690 | 12/2014 | Yamada et al. | |
| 2016/0294334 A1* | 10/2016 | Piel | H03F 1/52 |
| 2016/0300695 A1* | 10/2016 | Alt | H01J 37/32082 |
| 2018/0120889 A1* | 5/2018 | Grede | G06F 1/022 |
| 2018/0122621 A1* | 5/2018 | Grede | H01J 37/32174 |
| 2018/0123526 A1* | 5/2018 | Grede | H05K 1/18 |
| 2018/0138864 A1* | 5/2018 | Grede | H01J 37/32174 |
| 2018/0138869 A1* | 5/2018 | Grede | H01J 37/32174 |
| 2018/0301323 A1* | 10/2018 | Grede | H01J 37/3299 |
| 2018/0323040 A1* | 11/2018 | Alt | H01J 37/32082 |

FOREIGN PATENT DOCUMENTS

| | | |
|---|---|---|
| JP | H04-369272 | 12/1992 |
| JP | H08-65059 | 3/1996 |
| JP | H10-209642 | 8/1998 |
| JP | 2001-197749 | 7/2001 |
| JP | 2003-069351 | 3/2003 |
| JP | 2005-527078 | 9/2005 |
| JP | 4248637 B2 | 4/2009 |
| JP | 4271457 | 6/2009 |
| JP | 4271457 B2 | 6/2009 |
| JP | 2010-225930 | 10/2010 |
| JP | 2013-135159 | 7/2013 |
| JP | 2014-522216 | 8/2014 |
| WO | WO 2005/032226 | 4/2005 |
| WO | WO 2009/037995 | 3/2009 |
| WO | WO 2014/094737 | 6/2014 |
| WO | WO 2017/001599 | 1/2017 |
| WO | WO 2017/001594 | 5/2017 |

OTHER PUBLICATIONS

Bloem et al., "Extremely rugged 50 V LDMOS deviced capture ISM and Broadcast markets," NXP, Nov. 2013, 24 pages.

International Search Report and Written Opinion in International Application No. PCT/EP2016/065376, dated Oct. 26, 2016, 15 pages (with English translation).

Raab, "Broadband Class-E Power Amplifier for HF and VHF," Microwave Symposium Digest, IEEE, Jun. 2006, 902-905.

RF Power LDMOS Transistors High Ruggedness N-Channel Enhancement-Mode Lateral MOSFETs, Freescale Semiconductor Inc., 2014, 24 pages.

Franzis Elektronik: Neue professionelle Schaltungstechnik. 302 neue professionelle Schaltungen. Poing: Franzis Verlag GmbH, 2009, S335 (with English summary).

JP Office Action in Japanese Appln. No. 2017-568148, dated Feb. 12, 2020, 14 pages (with English translation).

Beltran, "Class F and inverse class-F power amplifier loading networks design based upon transmission zeros," In: 2014 IEEE MTT-S International Microwave Symposium, 2014, 4 pages.

Brouk and Heckmann, "Stabilizing RF Generator and Plasma Interactions," 2004 Society of Vacuum Coaters, 47th Annual Technical Conference Proceedings, Apr. 2004, pp. 49-54.

International Search Report and Written Opinion in International application No. PCT/EP2016/, dated Oct. 21, 2016, 22 pages (with English translation).

RF Power LDMOS Transistors High Ruggedness N-Channel Enhancement-Mode Lateral MOSFETs, Freescale Semiconductor Technical Data, 2014, 24 pages.

Skelton, Homebrew Cookbook, Radio Society of Great Britain, 2010, p. 115.

JP Office Action in Japanese Appln. No. 2017-568152, dated Feb. 12, 2020, 18 pages (with English translation).

\* cited by examiner

US 10,714,313 B2

HIGH FREQUENCY AMPLIFIER APPARATUSES

CROSS-REFERENCE TO RELATED APPLICATIONS

This application is a continuation of and claims priority under 35 U.S.C. § 120 from PCT Application No. PCT/EP2016/065376 filed on Jun. 30, 2016, which claims priority from German Application No. DE 10 2015 212 247.6, filed on Jun. 30, 2015. The entire contents of each of these priority applications are incorporated herein by reference.

TECHNICAL FIELD

The invention relates to high-frequency amplifiers that are suitable for generating output power of at least 1 kW (kilowatt) at frequencies of at least 2 MHz (Megahertz) for plasma excitation.

BACKGROUND

Devices of this type or similar devices are known for example from the following documents: US 2014/0167858 A1, US 2009/0027936 A1, U.S. Pat. No. 6,172,383 B1, U.S. Pat. No. 6,064,249 A.

Laterally Diffused Metal Oxide Semiconductor (LDMOS) transistors are known, for example, from the following documents: Freescale Semiconductor, Technical Data, RF Power LDMOS Transistors, Document Number: MRFE6VP61K25H Rev. 4.1, March 2014.

It is known to use transistors, such as LDMOS transistors, to generate high frequency power, for example power that is suitable for exciting a plasma. Transistors of this type are often intended for operation in amplifier class AB. However, if the transistors are to be used for other amplifier classes, e.g., class E or class F, it is often not possible to drive the transistors fully without exceeding the specifications of the manufacturer with regard to gate voltage. However, exceeding in this way can lead to the transistors failing and/or having a shorter service life.

SUMMARY

The present disclosure provides high-frequency amplifier apparatuses to prevent the above-mentioned disadvantages. These high-frequency amplifier apparatuses are suitable for generating output power of at least 1 kW (kilowatt) at frequencies of at least 2 MHz (Megahertz), for example, for plasma excitation. Each of these apparatuses includes two LDMOS transistors, which are each connected to a ground connection point by their respective source terminals. The LDMOS transistors can be embodied alike. The two transistors are arranged in a package. The apparatus also includes a circuit board, which lies flat on a metal cooling plate and is connected to the cooling plate, which can be connected to ground, by a plurality of ground connections. The package is arranged on the circuit board. The apparatus has a power transformer, the primary winding of which is connected to the drain terminals of the LDMOS transistors. The apparatus also has a signal transformer, the secondary winding of which is connected at a first end to the gate terminal of one LDMOS transistor by one or more resistive elements, and is connected at a second end to the gate terminal of the other LDMOS transistor by one or more resistive elements. Each gate terminal is connected to ground by at least one voltage-limiter.

Therefore, the LDMOS transistors can be driven fully without exceeding the permitted gate voltage. Because voltage-limiters are provided, the negative peak of a driving signal, which comes from the secondary winding of the signal transformer, receives the ground potential. Therefore, the negative voltage is limited to the voltage drop at the voltage-limiter and the positive peak voltage is increased. Accordingly, less driving power is necessary for drivers that actuate the LDMOS transistors. Additionally, the conduction angle, i.e., the time during which one or both transistors conduct during a cycle of the driving signal, is increased without the need to increase the peak voltage over a permitted value. In other words, the time in which a transistor is driven can be extended. Furthermore, because a higher DC voltage is achieved, the input signal is (in relative terms) more frequently above the threshold voltage Vth of the transistors; thus, the transistors are more frequently conductive.

Because of the connection of the two LDMOS transistors to the cooling plate, thermal loading of the LDMOS transistors can also be reduced, and, as a result, the likelihood of transistor failure is further reduced.

Furthermore, the ground connection point can be configured to transfer heat from the LDMOS transistors to the cooling plate. Accordingly, an even better dissipation of heat from the LDMOS transistors is ensured, and thermal loading of the LDMOS transistors is further reduced.

In some implementations, at least one voltage-limiter includes at least one diode, the cathode of which is arranged on the gate side and the anode of which is arranged on the ground side. As a result of this measure, the negative peak of the driving signal receives the ground potential through the conducting diode. The negative voltage of the driving signal is therefore limited to the voltage drop at the diode.

In some implementations, at least one voltage-limiter includes a plurality of diodes connected in series. This measure makes it possible to counteract a disadvantage that arises when the amplifier is operated in saturation, which causes the gate bias voltage to further increase and consequently the drain current also further increases, which leads to decreasing the efficiency. In some examples, a plurality of fast diodes can be connected in series. A fast diode within the meaning of the invention is a diode that has a reverse recovery time of less than a quarter of the cycle duration. At a driving frequency of the transistors of, e.g., 40.68 MHz (i.e., a cycle duration of approximately 25 ns), a quarter of the cycle duration is approximately 6 ns. In this example, the diodes should therefore have a reverse recovery time of 6 ns or less. Thus, a fast diode conducts only negligibly briefly in the reverse direction and blocks only negligibly briefly in the forward direction.

The series connection of diodes can include at least two diodes of different types. For example, the series connection can include a fast diode and a Z-diode.

In some implementations, at least one voltage-limiter includes at least one diode and one resistor, connected in series. This also can reduce the above-mentioned disadvantages. In some implementations, the high-frequency amplifier apparatus is symmetrical, i.e., the two LDMOS transistors have identical component arrangements.

In some implementations, the package is arranged on the circuit board. The package can therefore be cooled via the circuit board, which is connected to the cooling plate in a heat-conducting manner. The package can be arranged on a substrate. The package may be arranged in a housing. The housing of the package can be arranged in a cut-out in the circuit board. The terminals of the package can be contacted on the circuit board. The package can be mounted on a copper plate for the purpose of cooling. The copper plate can be used for transferring heat from the package to the cooling plate, for example, for heat distribution. The copper plate can be arranged in the same cut-out in the circuit board as the package. The copper plate can have a larger surface area than the surface of the package that faces the cooling plate. The cut-out can be stepped, so as to be matched to (e.g., be aligned with) the surfaces of the copper plate and the package. This can additionally increase the service life of the transistors, as they may not heat up to the same extent. In addition, an apparatus that is close to the cooling plate connected to ground can better suppress interference that may occur due to high currents during switching processes.

The circuit board can be a multi-layered circuit board, for example, a multi-layered circuit board having at least one inner layer, or a multi-layered circuit board having at least two, three, or four layers. An outer layer may be entirely connected to ground for direct installation and contact with the cooling plate, which is also connected to ground.

In some implementations, the power transformer is arranged on the circuit board or on a separate circuit board. In some examples, the primary winding is formed in a planar manner on the relevant circuit board. This results in a particularly cost-effective construction of the primary winding. The power transformer can also be easily cooled.

A gate terminal may be connected, by a resistor, to a capacitor connected to ground. The gate capacitance can be discharged through these parts and an operating point voltage source. In some examples, the resistor has a resistance value of less than 1 kΩ (kilo ohm) and the capacitor has a capacitance of more than 1 nF (nanofarad).

In some implementations, the resistors are connected to a common capacitor, which in turn may be connected to the operating point voltage source.

Additional features and advantages of the invention can be found in the following detailed description of embodiments of the invention, with reference to the figures of the drawings, and in the claims. The features shown therein are not necessarily to scale. The different features may each be implemented in isolation or together in any desired combinations in variants of the invention.

Embodiments of the invention are shown in the schematic drawings and are explained in detail in the following description.

DETAILED DESCRIPTION

Figure 1:
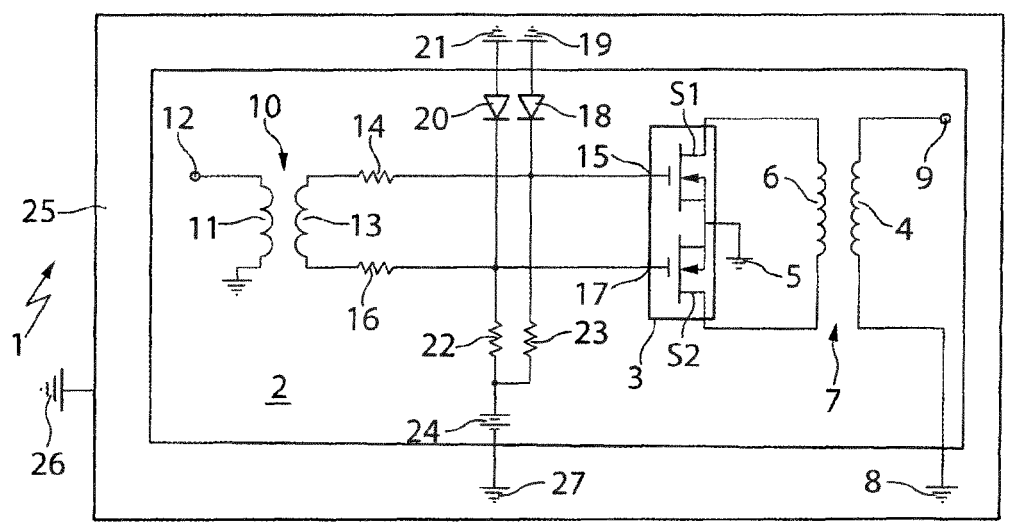
FIG. 1 is a schematic circuit diagram that shows a first embodiment of a high-frequency amplifier apparatus, according to an embodiment of the invention.

FIG. 1 shows a first embodiment of a high-frequency amplifier apparatus 1. The high-frequency amplifier apparatus 1 includes a circuit board 2, on which a package 3 is arranged. The package 3 includes two LDMOS transistors S1, S2, which are embodied alike and are each connected to a ground connection point 5 by their respective source terminals. The LDMOS transistors S1, S2 are each connected by their respective drain terminals to an end of a primary winding 6 of a power transformer 7. The secondary winding 4 of the power transformer 7 is connected to ground 8 and to a high-frequency output 9. The high-frequency amplifier apparatus 1 further includes a signal transformer 10, which includes a primary winding 11 that is connected to a high-frequency input 12. The secondary winding 13 of the signal transformer 10 is connected to the gate terminal 15 of the LDMOS transistor S1 by a resistive element 14, for example, a resistor. The secondary winding 13 is also connected to the gate terminal 17 of the LDMOS transistor S2 by a resistive element 16, for example, a resistor. The resistive elements 14, 16 and the secondary winding 13 are thus connected in series. The signal transformer 10 is also arranged on the circuit board 2, as is the power transformer 7.

The gate terminal 15 is connected to earth 19 by a voltage-limiter 18, which is formed as a diode in this case. In this case, the cathode of the diode is arranged on the gate side and the anode is arranged on the ground side. Correspondingly, the gate terminal 17 is also connected to earth 21 by a voltage-limiter 20, which is also formed as a diode in this case. This arrangement makes it possible for the control signals of the gate terminals 15, 17 to be voltage-shifted (amplitude-shifted).

The gate terminals 15, 17 are additionally connected, by means of resistors 22, 23, to a DC voltage source 24, i.e., an operating point voltage source. A driving circuit for generating the driving signals of the LDMOS transistors S1, S2 thus includes, in the embodiment in FIG. 1, the high-frequency input 12, the signal transformer 10, the resistive elements 14, 16, the voltage-limiters 18, 20, the resistors 22, 23 and the DC voltage source 24.

The circuit board 2 lies flat on a cooling plate 25, which can also be connected to ground 26. For example, the circuit board 2 is connected to the cooling plate 25 by a plurality of ground connections 8, 19, 21, 27. The ground connection 5 is a ground connection point for transferring heat from the LDMOS transistors S1, S2 to the cooling plate 25.

Figure 2:
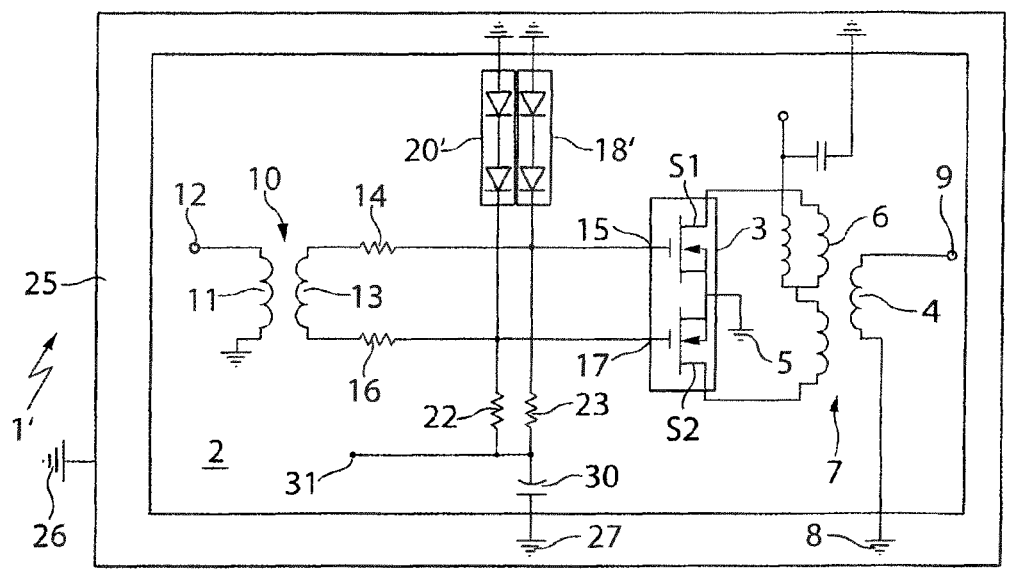
FIG. 2 is a schematic circuit diagram that shows a second embodiment of a high-frequency amplifier apparatus, according to an embodiment of the invention.

FIG. 2 shows an alternative embodiment of a high-frequency amplifier apparatus 1', in which the components that correspond to those in FIG. 1 have the same reference signs. One difference of the high-frequency amplifier apparatus 1' from the apparatus 1 is that the voltage-limiter 18' in this case includes two diodes connected in series. The voltage-limiter 20' is designed correspondingly.

A further difference is that the resistors 22, 23 are connected to a capacitor 30 that is in turn connected to ground 27. A DC voltage source (operating point voltage source) is connected to the terminal 31.

Figure 3:
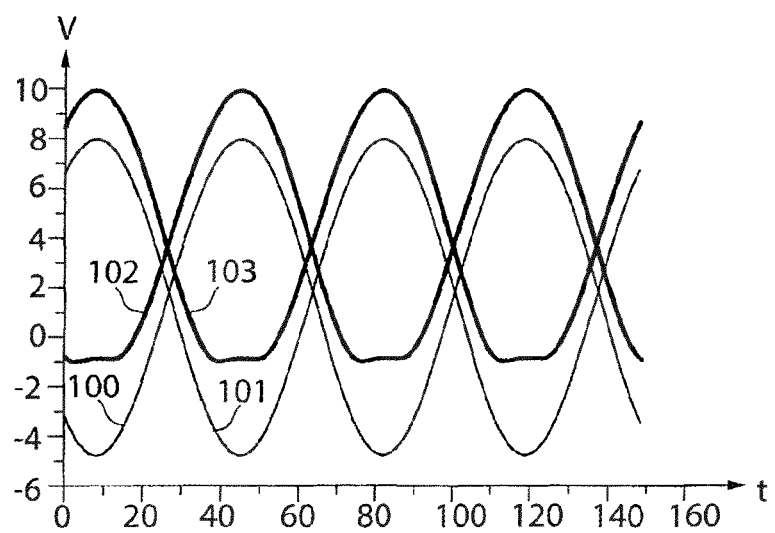
FIG. 3 is a graph that shows two different voltage curves to illustrate the effect of an embodiment of the invention on a driving voltage.

FIG. 3 shows a plurality of voltage curves over time, as they are applied to the gate terminals 15, 17 as driving signals. The voltage curve 100 is applied to the gate terminal 15 if no voltage-limiter 18 or 18' is available. The voltage curve 101 is applied correspondingly to the gate terminal 17 if no voltage-limiter 20 or 20' is available. The effect of the voltage-limiters 18, 18', 20, 20' is visible in the voltage curves 102, 103, where the negative peak of the voltage curves 102, 103 is limited approximately to the voltage of the voltage-limiter 18, 18', 20, 20', for example, to the voltage drop at one or more diodes. Overall, the voltage of the voltage curves 102, 103, which are applied to the gate terminals 15, 17, is shifted to higher voltage values when a voltage-limiter 18, 18', 20, 20' is used. In other words, the positive peak voltage is increased and the negative peak of the driving signals of the gate terminals 15, 17 is limited to the voltage drop, for example at the diodes, of the voltage-limiter 18, 18', 20, 20'. As a result, a lower driving power, i.e. power of the high frequency signal at the high-frequency input 12, is required. A lower gate voltage leads to a reduction in the risk of failure of the LDMOS transistors S1, S2.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A high-frequency amplifier apparatus suitable for generating power for plasma excitation, the apparatus comprising:
    two Laterally Diffused Metal Oxide Semiconductor (LDMOS) transistors each having a drain terminal and a source terminal that is connected to a ground connection point, wherein the LDMOS transistors are embodied alike and are arranged as a package;
    a circuit board that lies flat on a metal cooling plate and is connected to the cooling plate, wherein the cooling plate is connectable to ground by a plurality of ground connections, wherein the package is arranged on the circuit board;
    a power transformer including a primary winding connected to the drain terminals of the two LDMOS transistors; and
    a signal transformer including a secondary winding having a first end and a second end, wherein
    the secondary winding is connected at the first end to a first gate terminal of one of the two LDMOS transistors by one or more first resistive elements, and
    the secondary winding is connected at the second end to a second gate terminal of the other of the two LDMOS transistors by one or more second resistive elements; and
    wherein each of the first gate terminal and second gate terminal is connected to ground by one or more voltage-limiters.

2. The apparatus of claim 1, wherein the ground connection point is configured to transfer heat from the two LDMOS transistors to the cooling plate.

3. The apparatus of claim 1, wherein each of the first gate terminal and the second gate terminal is connected by a resistor to a capacitor connected to ground.

4. The apparatus of claim 3, wherein the resistor has a resistance value of less than 1 kilo-ohm and the capacitor has a capacitance of more than 1 nanofarad.

5. The apparatus of claim 1, wherein the apparatus is symmetrical, and wherein the two LDMOS transistors have identical component arrangements.

6. The apparatus of claim 1, wherein the package is arranged on the circuit board such that the package is cooled via the circuit board that is connected to the cooling plate in a heat-conducting manner.

* * * * *